(12) United States Patent
Ji et al.

(10) Patent No.: US 10,511,185 B2
(45) Date of Patent: Dec. 17, 2019

(54) SOLAR OUTDOOR FURNITURE

(71) Applicant: Zhejiang Yotrio Group Co., Ltd., Linhai (CN)

(72) Inventors: Kai Ji, Linhai (CN); Jianping Xie, Linhai (CN)

(73) Assignee: ZHEJIANG YOTRIO GROUP CO., LTD., Linhai (CN)

( * ) Notice: Subject to any disclaimer, the term of this patent is extended or adjusted under 35 U.S.C. 154(b) by 0 days.

(21) Appl. No.: 15/870,862

(22) Filed: Jan. 13, 2018

(65) Prior Publication Data

US 2018/0358838 A1 Dec. 13, 2018

(30) Foreign Application Priority Data

Jun. 12, 2017 (CN) .................... 2017 2 0680049 U

(51) Int. Cl.
| | | |
|---|---|---|
| *H01M 10/44* | (2006.01) | |
| *H02J 7/35* | (2006.01) | |
| *H02S 10/40* | (2014.01) | |
| *H02S 40/38* | (2014.01) | |
| *H01L 31/042* | (2014.01) | |
| *H02J 7/02* | (2016.01) | |
| *A47B 83/02* | (2006.01) | |
| *H02J 7/00* | (2006.01) | |
| *H01M 10/46* | (2006.01) | |

(52) U.S. Cl.
CPC ............ *H02J 7/35* (2013.01); *A47B 83/02* (2013.01); *H01L 31/042* (2013.01); *H02J 7/0052* (2013.01); *H02J 7/025* (2013.01); *H02S 10/40* (2014.12); *H02S 40/38* (2014.12); *H01M 10/465* (2013.01); *H01M 2220/30* (2013.01); *H02J 7/0044* (2013.01); *H02J 2007/005* (2013.01); *H02J 2007/0062* (2013.01)

(58) Field of Classification Search
CPC ...................................................... H02J 7/35
USPC ......................................................... 320/101
See application file for complete search history.

(56) References Cited

U.S. PATENT DOCUMENTS

| | | | | |
|---|---|---|---|---|
| 8,002,349 B1 * | 8/2011 | Pizzuto | .................. | A47C 1/143 297/184.11 |
| 8,016,351 B2 * | 9/2011 | Cassaday | ............... | A47C 1/022 297/217.1 |
| 8,185,762 B1 * | 5/2012 | Spangler | ............... | G06F 1/3265 713/323 |
| 8,388,056 B2 * | 3/2013 | Smith | .................... | A47C 4/286 297/16.2 |
| 8,482,246 B2 * | 7/2013 | Eiman | ........................ | H02J 7/35 136/243 |

(Continued)

*Primary Examiner* — Yalkew Fantu
(74) *Attorney, Agent, or Firm* — Schwegman Lundberg & Woessner, P.A.

(57) ABSTRACT

Solar outdoor furniture provided by this invention includes a furniture body, a control module and a solar power generation module. The furniture body has an object holding portion, and the object holding portion has a glass panel. The control module is disposed at the object holding portion. The solar power generation module is disposed at one side of the glass panel and electrically connected with the control module. The solar outdoor furniture provided in this invention is capable of self-supply of power and is green and environmentally-friendly. In addition, the solar outdoor furniture can supply power to peripheral device for users to entertain, thereby achieving the multi-function of outdoor furniture.

10 Claims, 5 Drawing Sheets

(56) References Cited

U.S. PATENT DOCUMENTS

2013/0033222 A1\* 2/2013 Hixson ................ E04H 1/1211
320/101

\* cited by examiner

E-E

SOLAR OUTDOOR FURNITURE

CROSS-REFERENCE TO RELATED APPLICATIONS

This Non-provisional application claims priority under 35 U.S.C. § 119(a) on Patent Application No(s). 201720680049.5 filed in People's Republic of China on Jun. 12, 2017, the entire contents of which are hereby incorporated by reference.

BACKGROUND OF THE INVENTION

Field of the Invention

The present invention relates to a kind of furniture, and more especially, to a piece of solar outdoor furniture.

Description of Related Art

Conventional furniture, such as sofas, usually only has a single function, for example allowing users to have their bodies relaxed and rested. However, with the development of science and technology, people have an increasing demand for leisure and entertainment, electronic products have gradually become an inseparable part of life. Conventional furniture cannot provide users with spiritual entertainment and satisfaction.

When users use electronic products for leisure and entertainment, as power consumption of electronic products is relatively fast, electronic products usually have a requirement of being charged. When users are outdoors, if there is no charging interface nearby, it is very inconvenient. Even if there is furniture placed outdoor for users to rest, because of reasons such as power exhaustion and so on, users still cannot use electronic products all the time when rest, which cannot achieve the leisure and entertainment integration really. As a result, the placement and arrangement of outdoor furniture are often limited by the location of charging interfaces.

Sometimes, when uses electronic products for work or leisure and entertainment, getting connected to the Internet (such as checking and sending e-mails, watching videos or playing games and so on online) is required. However, the WIFI signals of many places in the outdoors are relatively weak and the speed is very slow in. Therefore, if consumers want to access the Internet in the outdoors, in most cases, because of the problem of weak WIFI signals, they can only use the data provided by network service providers. However, in this way, the Internet cost is relatively high, and the speed is not fast.

BRIEF SUMMARY OF THE INVENTION

To overcome at least one disadvantage of the prior art, the present invention provides a piece of solar outdoor furniture.

To achieve above objectives, the solar outdoor furniture provided in the invention includes a furniture body, a control module and a solar power generation module. The furniture body has an object holding portion, and the object holding portion has a glass panel. The control module is disposed at the object holding portion. The solar power generation module is disposed at one side of the glass panel and electrically connected with the control module.

In one embodiment of the invention, the solar outdoor furniture may further include a WIFI signal enhancement module electrically connected with the control module.

In one embodiment of the invention, the solar outdoor furniture may further include a wireless charging module electrically connected with the control module.

In one embodiment of the invention, the solar outdoor furniture may further include an LED module electrically connected with the control module.

In one embodiment of the invention, the object holding portion may further include an aluminum frame, and the solar power generation module may be sealed in the glass panel and the aluminum frame.

In one embodiment of the invention, the control module may include an integrated circuit and a storage battery, the integrated circuit and the storage battery may be electrically connected with each other, and the storage battery may be electrically connected with the solar power generation module.

In one embodiment of the invention, the control module may further have a touch-sensitive switch.

In one embodiment of the invention, the solar outdoor furniture may further include at least one interface electrically connected with the control module.

In one embodiment of the invention, at least one interface may be a USB interface.

In one embodiment of the invention, the interface may be provided with a rubber stopper.

To sum up, the solar outdoor furniture provided in the invention is capable of self-supply of power and is green and environmentally-friendly. In addition, the solar outdoor furniture can supply power to peripheral device for users to entertain, thereby achieving the multi-function for outdoor furniture. Because of the capability of power self-supply, the installation location of the solar outdoor furniture is no longer subject to the restriction of external charging interfaces and can be placed flexibly. Furthermore, both the solar power generation module and the control module in the solar outdoor furniture provided in the invention are independent modules, which can realize batch production, reduce production costs, and make the assembly, disassembly and maintenance convenient at the same time, and reduce maintenance costs. In particular, the solar power generation module, the control module and the object holding portion of the invention are integrated together to form a modularization as well. No matter what kind of furniture the solar outdoor furniture of the invention is, that will do as long as combine the modularized solar power generation module, control module and object holding portion with different furniture bodies, which expands the applicability. In the prior art, the solar power generation module is directly embedded into the furniture body. Since service life of the electronic products and service life of the furniture body is inconsistent, therefore when the solar power generation module or the control module needs to be maintained or replaced, the existing furniture cannot be repaired or replaced partially. In contrast, the solar outdoor furniture of this invention can realize partial replacement or maintenance, which greatly reduces the maintenance costs.

In order to make the above-mentioned and other objectives, features and advantages of the invention be clearly understood, descriptions in detain are as follow with preferable embodiments below and accompany drawings.

DETAILED DESCRIPTION OF THE INVENTION

Figure 1:
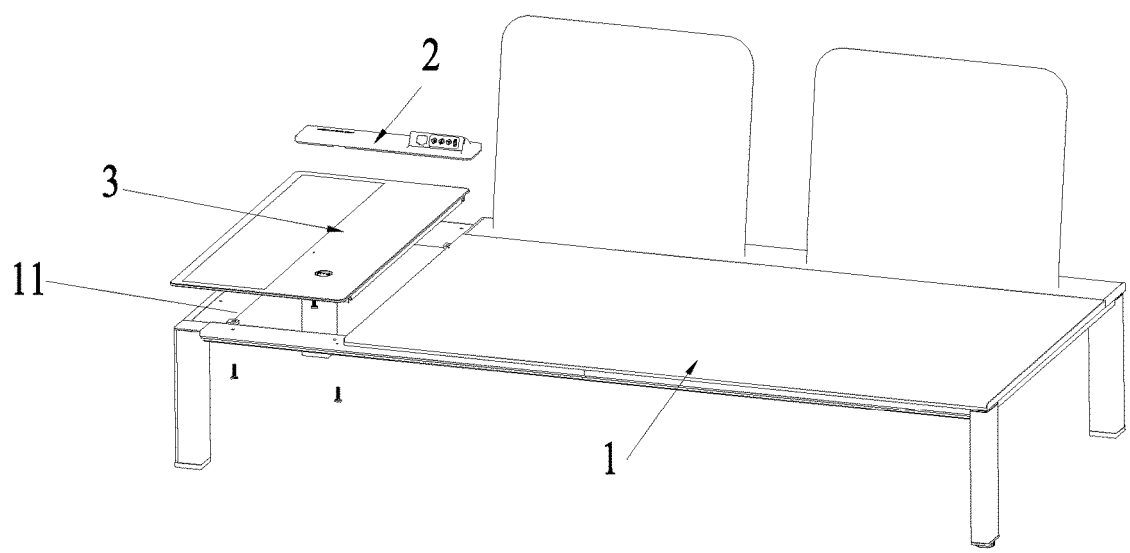
FIG. 1 is a partial exploded diagram of a piece of solar outdoor furniture provided according to one embodiment of the invention.
Figure 2:
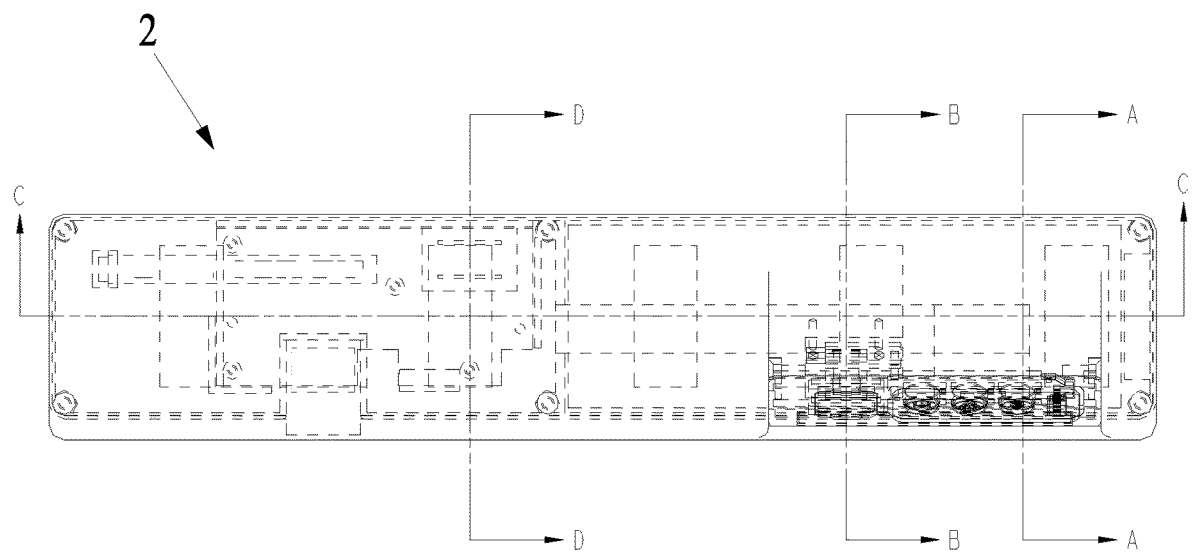
FIG. 2 is a schematic diagram of a control module in the solar outdoor furniture according to one embodiment of the invention.
Figure 3:
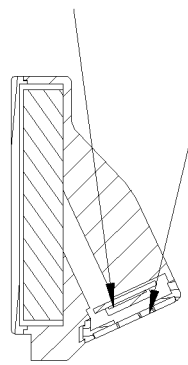
FIG. 3 is a sectional view in the direction of A-A in FIG. 2.
Figure 4:
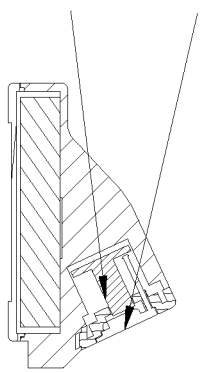
FIG. 4 is a sectional view in the direction of B-B in FIG. 2.
Figure 5:
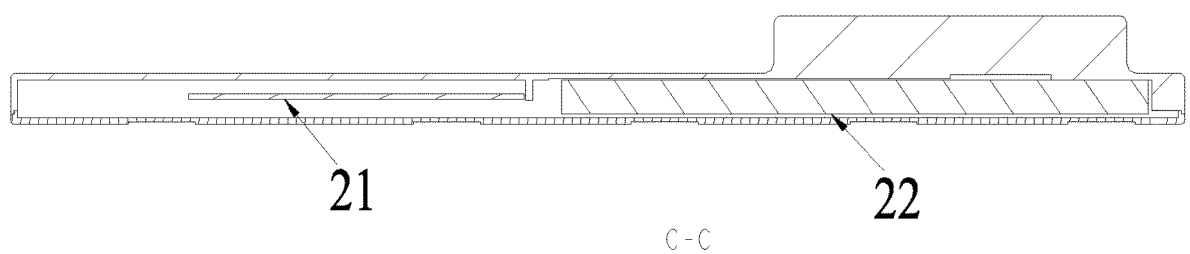
FIG. 5 is a sectional view in the direction of C-C in FIG. 2.
Figure 6:
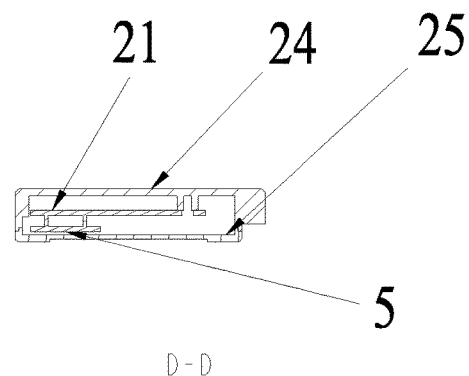
FIG. 6 is a sectional view in the direction of D-D in FIG. 2.
Figure 7:
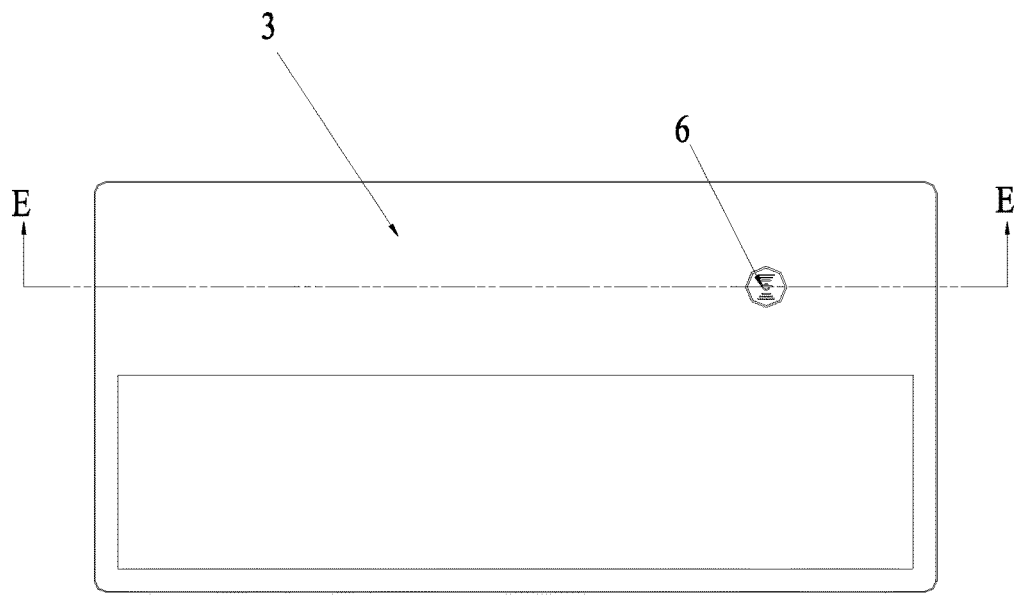
FIG. 7 is a schematic diagram of a solar power generation module in the solar outdoor furniture according to one embodiment of the invention.
Figure 8:
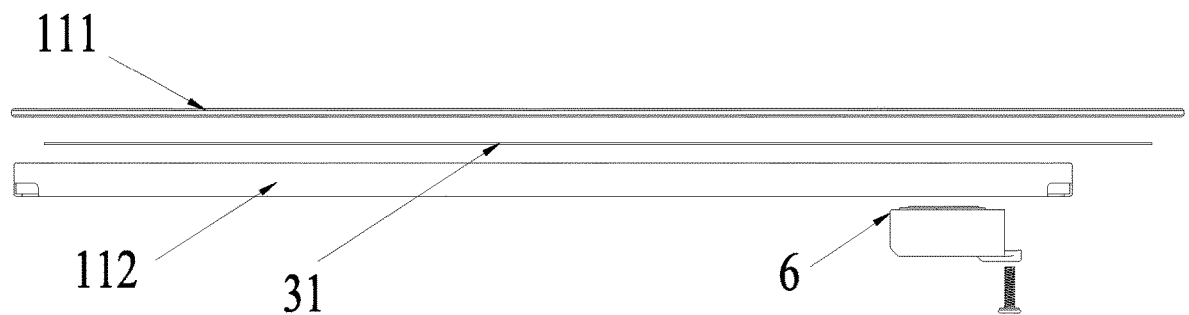
FIG. 8 is a sectional view in the direction of E-E in FIG. 7.
Figure 9:
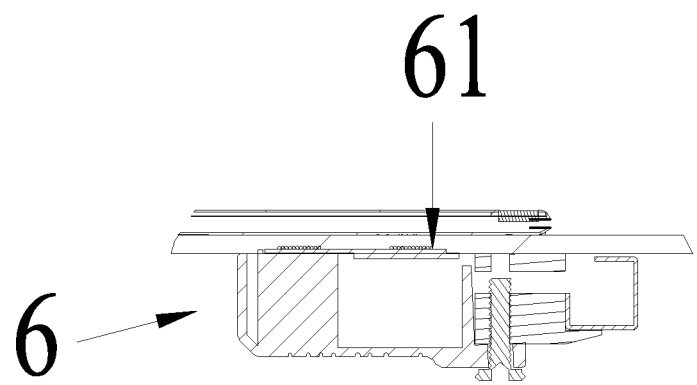
FIG. 9 is a sectional view of a wireless charging module in the solar outdoor furniture according to one embodiment of the invention.
Figure 10:
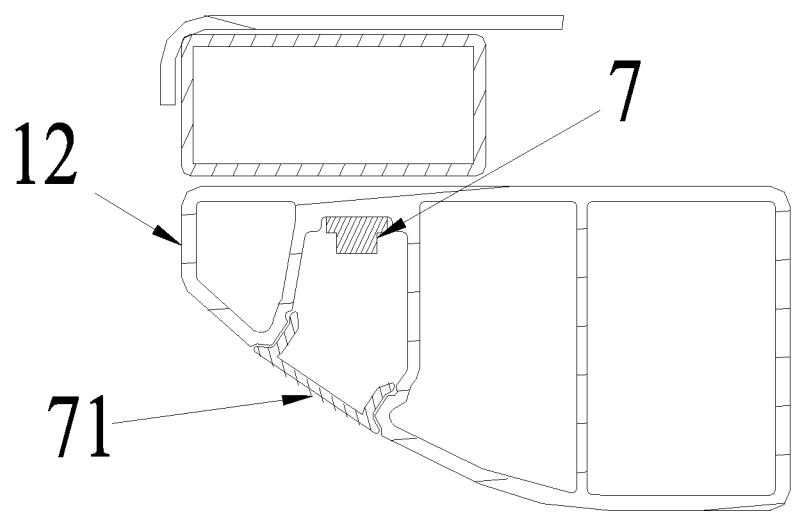
FIG. 10 is a sectional view of an LED module in the solar outdoor furniture according to one embodiment of the invention.

Please refer to FIG. 1 to FIG. 10 together. Solar outdoor furniture provided in the invention includes a furniture body 1, a control module 2, and a solar power generation module 3.

The furniture body 1 has an object holding portion 11, and the object holding portion 11 has a glass panel 111. In practical use, the glass panel 111 is the glass table top of the object holding portion 11, and the glass panel 111 can directly be used to support objects. In this embodiment, the furniture body 1 is a sofa (a seat cushion and a back cushion of the sofa are omitted in FIG. 1), that is, the solar outdoor furniture in this embodiment is an outdoor sofa, but the invention is not intended to limit it thereto. In other embodiments, the furniture body can be a chair, therefore the solar outdoor furniture is an outdoor leisure chair correspondingly. In other embodiments, the solar outdoor furniture can also be a coffee table and so on.

The solar power generation module 3 is disposed at one side of the glass panel 111 and electrically connected with the control module 2. In practical applications, the solar power generation module 3 includes at least one photovoltaic panel 31, and the object holding portion 11 further has an aluminum frame 112. The glass panel 111 is combined with the aluminum frame 112 below so as to become a module in which the photovoltaic panel 31 is sealed, and they can be arbitrarily assembled and disassembled by a screw. A circuit in the aluminum frame 112 is connected to the control module 2. By setting the solar power generation module 3, the solar outdoor furniture provided in the invention is capable of self-supply electric energy and is green and environmentally-friendly. In addition, the solar outdoor furniture can supply power to peripheral device for users to entertain, such that achieving the multi-function for outdoor furniture Because of the capability of power self-supply, the installation location of the solar outdoor furniture is no longer subject to the restriction of external charging interfaces and can be placed flexibly.

The invention adopts the glass panel 111 to seal the solar power generation module 3. Firstly, as a light transmission property of the glass can ensure that the sunlight can be transmitted to the solar power generation module 3 through the glass panel 111. Meanwhile through a specific high-and-low-temperature sealing process, under a state that the original efficiency of the photovoltaic panel 31 is basically maintained, the photovoltaic plate 31 can be quickly sealed onto the glass panel 111. Then the solar power module 3 is integrated with the corresponding glass panel 111 and the aluminum frame 112 to form an independent module, which realizes the rapid sealing and modularization, improves the production efficiency and reduces the defect rate of products.

The control module 2 is disposed at the object holding portion 11. The control module 2 includes an integrated circuit 21 and a storage battery 22 electrically-connected with each other. The integrated circuit 21 coordinates and controls an entire circuit system, and controls the storage battery 22 to let external device (such as the interfaces and the LED modules mentioned below) be charged. Specifically, when the furniture in the invention is used outdoors during the daytime, the integrated circuit 21 first detects the electricity storage condition of the storage battery 22, and then performs a corresponding control action according to the electricity storage condition. If the electricity of the storage battery 22 is detected to be insufficient, the integrated circuit 21 will communicates the storage battery 22 and the solar power generation module 3. The solar power generation module 3 receives the solar power and converts the solar power into electrical energy to let the storage battery 22 charged then. If the storage battery 22 is detected to be sufficient, the integrated circuit 21 will automatically disconnect the charging circuit to protect the storage battery 22. In this embodiment, the storage battery 22 and the integrated circuit 21 are connected through a standard plug. This arrangement enables the two to be freely replaced, which makes it convenient to manufacture and repair.

In this embodiment, the solar outdoor furniture further includes at least one interface 4 electrically connected with the control module 2. In this embodiment, the interface 4 may be a USB interface. However, the invention does not limit the type and number of interfaces. The adoption of USB interfaces can adapt themselves to most of the mobile devices on the market for charging. However, the invention may be additionally provided with a corresponding interface for connecting Apple's devices or special interfaces for connecting other devices.

In this embodiment, a rubber stopper 41 can be disposed at the interface 4. When the interface 4 is not in use, the rubber stopper 41 blocks the interface. Being soft and flexible, the rubber stopper can be pulled out when in use and plugged back when not in use, such that can completely prevent the outside dirt and water from entering into the interface 4.

Preferably, one end of the rubber stopper 41 is fixed, therefore the rubber stopper cannot be completely separated, which avoids the loss of the rubber stopper 41 effectively. However, the present invention is not intended to limit it. In other embodiments, the rubber stopper 41 may not be provided, and alternatively, the structure at which the interface 4 is located may be set as a rotatable structure. When users want to use the interface 4, the interface 4 can be rotated out by way of rotation. When users do not want to use the interface 4, the interface of the interface 4 is rotated inward. In this way, it can also effectively avoid the outside dirt and water from entering into the interface 4.

In this embodiment, in order to control the functions of turn-on and turn-off of the interface 4, the control module 2 can have a touch-sensitive switch 23. Touching the touch-sensitive switch 23 with a finger or by other sensible means make the integrated circuit 21 recognize the functions of turn-on or turn-off, thus allowing the interface 4 to charge to external devices. Through this setting, the working or not working of the interface 4 can be precisely controlled. When external devices do not need to be charged by the interface 4, it can be controlled only by the way of clicking the touch-sensitive switch 23. It avoids a shortcoming in the prior art that the corresponding connection and disconnection can only be realized by plugging and pulling out the interface 4 frequently, which prolongs the service life of the interface 4. In addition, when the interface 4 is not needed, as the connection between the interface 4 and the storage battery 22 is directly disconnected, it is more power saving, energy saving and environmental protective.

In this embodiment, an acrylic panel 231 may be disposed at the touch-sensitive switch 23. The transparent acrylic plate 231 plays a protective role on the touch-sensing switch 23 while playing a decorative role. But the present invention is not intended to limit it.

In this embodiment, the solar outdoor furniture further has a WIFI signal enhancement module 5 electrically connected with the control module 2. The WIFI signal enhancement module 5 can enhance weak WIFI signal sources and enlarge the range so as to bring users a better surfing experience, which further achieves the multi-functionalization of the solar outdoor furniture in the invention.

Specifically, the solar outdoor furniture includes an outer shell 24 and a bottom shell 25, and the control module 2 is fixed in a space formed by the outer shell 24 and the bottom shell 25. The WIFI signal enhancement module 5 is connected on the integrated circuit 21 and is operated through the touch-sensitive switch 23 on the control module 2, so that the WIFI signal enhancement module 5 is in the ON or OFF state. This design makes the product become highly integrated, and the integrated circuit 21 can acquire various functions by way of connecting and disconnecting the function keys.

In this embodiment, the solar outdoor furniture further includes a wireless charging module 6 electrically connected with the control module 2. In this embodiment, the wireless charging module 6 is disposed at one side of the glass panel 111, that is, below the glass panel 111. The wireless charging module 6 includes a wireless charging transmitter coil 61. The wireless charging module 6 is fixed through a screw and can be easily replaced, disassembled and repaired. After the system is started, the wireless charging module 6 is energized, and the wireless charging transmitter coil 61 generates a magnetic field. The magnetic field passes through the glass panel 111 and generates induction with mobile devices, within the adaptation range, so as to drive an adaptation apparatus in the devices to generate a charging current for wireless charging. Through this arrangement, users can charge to electronic products without carrying USB cables and will not be subject to the restriction of whether the charging interfaces are fit or not.

In this embodiment, the solar outdoor furniture further includes an LED module 7 electrically connected with the control module 2. In this embodiment, the LED module 7 is disposed at the furniture body 1. Specifically, the furniture body 1 has an outer frame 12, and the LED module 7 is fixed in the covered groove of the outer frame 12 by a screw. The outer portion is enclosed by a translucent lampshade material 71 to form an entire assembly for easy assembly and disassembly. By controlling the touch-sensitive switch 23 on the control module 2, the light can be turned on or turned off, and the operation is simple and practical.

To sum up, the solar outdoor furniture provided in the invention is capable of self-supply electric energy and is green and environmentally-friendly. In addition, the solar outdoor furniture can supply power to peripheral device for users to entertain, such that achieving the multi-function for outdoor furniture Because of the capability of power self-supply, the installation location of the solar outdoor furniture is no longer subject to the restriction of external charging interfaces and can be placed flexibly. Furthermore, both the solar power generation module and the control module in the solar outdoor furniture provided in the invention are independent modules, which can realize batch production, reduce production costs, make the assembly, disassembly and maintenance convenient at the same time, and reduce maintenance costs. In particular, the solar power generation module, the control module and the object holding portion of the invention are integrated together to form a modularization as well. No matter what kind of furniture the solar outdoor furniture of the invention is, that will do as long as combine the modularized solar power generation module, control module and object holding portion with different furniture bodies, which expands the applicability. In the prior art, the solar power generation module is directly embedded into the furniture body. Since service life of the electronic products and service life of the furniture body is inconsistent, therefore when the solar power generation module or the control module needs to be maintained or replaced, the existing furniture cannot be repaired or replaced partially. In contrast, the solar outdoor furniture of this invention can realize partial replacement or maintenance, which greatly reduces the maintenance costs.

Although the present invention has been described in considerable detail with reference to certain preferred embodiments thereof, the disclosure is not for limiting the scope of the invention. Persons having ordinary skill in the art may make various modifications and changes without departing from the scope and spirit of the invention. Therefore, the scope of the appended claims should not be limited to the description of the preferred embodiments described above.

What is claimed is:

1. Solar outdoor furniture, comprising:
   a furniture body having an object holding portion, and the object holding portion having a glass panel;
   a control module disposed at the object holding portion; and
   a solar power generation module disposed at one side of the glass panel and electrically connected with the control module;
   wherein the solar power generation module comprises at least one photovoltaic panel, the object holding portion further has an aluminum frame; the glass panel is combined with the aluminum frame below glass panel so as to become a module, the photovoltaic panel is sealed in the module, and a circuit in the aluminum frame is connected to the control module.

2. The solar outdoor furniture according to claim 1, further comprising a WIFI signal enhancement module electrically connected with the control module.

3. The solar outdoor furniture according to claim 1, further comprising a wireless charging module electrically connected with the control module.

4. The solar outdoor furniture according to claim 1, further comprising an LED module electrically connected with the control module.

5. The solar outdoor furniture according to claim 1, wherein the object holding portion further comprises an aluminum frame, and the solar power generation module is sealed in the glass panel and the aluminum frame.

6. The solar outdoor furniture according to claim 1, wherein the control module comprises an integrated circuit and a storage battery, the integrated circuit and the storage battery are electrically connected with each other, and the storage battery is electrically connected with the solar power generation module.

7. The solar outdoor furniture according to claim 1, wherein the control module further has a touch-sensitive switch.

8. The solar outdoor furniture according to claim 1, further comprising at least one interface electrically connected with the control module.

9. The solar outdoor furniture according to claim 8, wherein at least one interface is a USB interface.

10. The solar outdoor furniture according to claim 8, wherein the at least one interface is provided with a rubber stopper.

\* \* \* \* \*